United States Patent [19]
Furukawa et al.

[11] Patent Number: 5,490,041
[45] Date of Patent: Feb. 6, 1996

[54] SEMICONDUCTOR INTEGRATED CIRCUIT MODULE AND A SEMICONDUCTOR INTEGRATED CIRCUIT DEVICE STACKING THE SAME

[75] Inventors: Hitonobu Furukawa, Neyagawa; Hayami Matsunaga, Hirakata; Yoshikazu Suehiro, Ikoma; Masao Iwata, Hirakata; Takeo Yasuho, Neyagawa; Izumi Okamoto, Osaka; Kazuo Takeda, Kyoto; Shuji Ida, Osaka, all of Japan

[73] Assignee: Matsushita Electric Industrial Co., Ltd., Osaka, Japan

[21] Appl. No.: 222,487

[22] Filed: Apr. 4, 1994

[30] Foreign Application Priority Data

Nov. 15, 1993 [JP] Japan ..................... 5-284801

[51] Int. Cl.$^6$ .................. H05K 7/02; H05K 7/06
[52] U.S. Cl. .................. 361/777; 257/686; 361/736; 361/744; 361/790; 361/820; 439/68
[58] Field of Search .................... 361/736, 744, 361/782, 789, 790, 777, 820; 257/678, 686; 437/208, 915; 439/44, 47, 55, 68, 70, 72, 74

[56] References Cited

U.S. PATENT DOCUMENTS

| | | | |
|---|---|---|---|
| 3,340,439 | 9/1967 | Henschen et al. | 361/735 |
| 4,982,265 | 1/1991 | Watanabe et al. | |
| 4,996,583 | 2/1991 | Hatada . | |
| 5,303,119 | 4/1994 | Hilbrink | 361/744 |
| 5,346,402 | 9/1994 | Yasuho et al. | 361/735 |

FOREIGN PATENT DOCUMENTS

| | | | |
|---|---|---|---|
| 0339154 | 11/1989 | European Pat. Off. | 361/735 |
| 1-170028 | 7/1989 | Japan | 257/668 |
| 4-26152 | 1/1992 | Japan . | |
| 4-214695 | 8/1992 | Japan | 361/783 |
| 5-14427 | 2/1993 | Japan . | |
| WO/8604208 | 7/1986 | WIPO | 361/783 |

*Primary Examiner*—Leo P. Picard
*Assistant Examiner*—Donald Sparks
*Attorney, Agent, or Firm*—Ratner & Prestia

[57] ABSTRACT

A plurality of memory modules are stacked so as to form a multilayer integrated memory circuit. All of the memory modules have a plurality of bare memory IC chips mounted thereon, and have the same structure, the same circuit configuration and the same terminal arrangement in lead frames with each other. Each of the memory modules to be stacked in each layer is rotated by 90°, 180° or 270° before being stacked and connected to each other. Thus, in the multi-layered memory circuit, it is possible that signals can be selectively input/output to/from a particular layer in the multilayer structure, although the lead terminals of each of memory modules has the same configuration and the same arrangement with each other. As a result, a small-size integrated memory circuit device with a large memory-capacity can be provided, which can be fabricated easily and efficiently. A higher processing speed of digital computers can be also achieved.

33 Claims, 12 Drawing Sheets

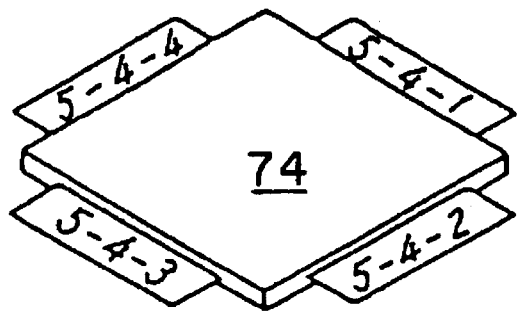
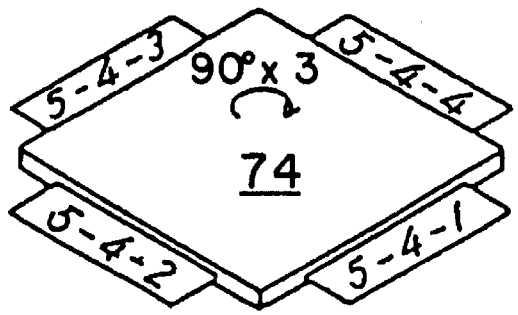
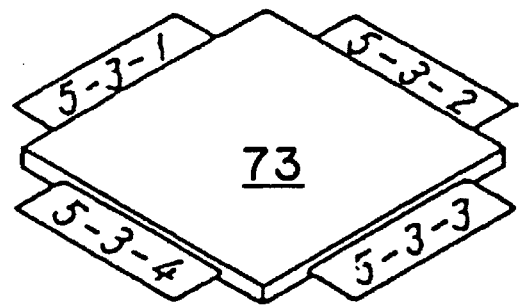
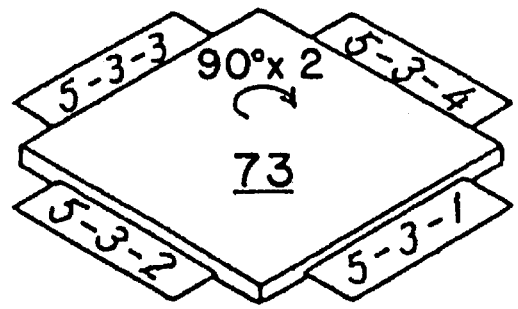
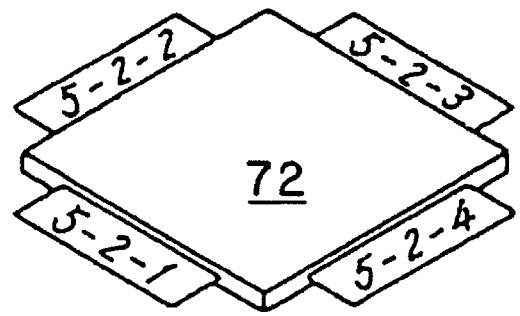
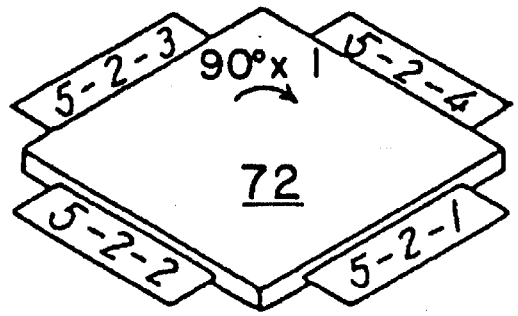
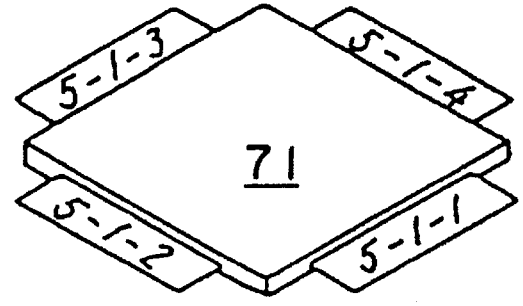
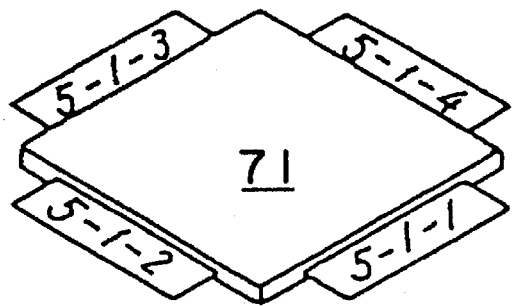
FIG. 5A          FIG. 5B

SEMICONDUCTOR INTEGRATED CIRCUIT MODULE AND A SEMICONDUCTOR INTEGRATED CIRCUIT DEVICE STACKING THE SAME

BACKGROUND OF THE INVENTION

1. Field of the Invention

The present invention relates to a semiconductor integrated circuit module and a semiconductor integrated circuit device stacking the same which are used in digital computers such as workstations, personal computers or the like. Particularly, the present invention relates to a semiconductor integrated circuit module in which a plurality of monolithic bare IC chips or a plurality of TAB packages are mounted, and a semiconductor integrated circuit device in which a plurality of the same are stacked.

2. Description of the Related Art

In digital computers, semiconductor integrated circuit devices are usually used in which IC chips are mounted on a printed circuit board by soldering. Hereinafter, a conventional semiconductor integrated circuit device is described by way of explaining an internal memory circuit as an example.

FIG. 1 is a perspective view illustrating an example of such a conventional internal memory circuit. Four memory ICs 11a–11d are mounted on a printed circuit board 14. The printed circuit board 14 is a four-layered Cu-clad board which has a base sheet made of a glass textile soaked with an epoxy resin. The printed circuit board 14 is provided with signal wirings such as an address bus and a data bus (not shown in FIG. 1, see FIG. 2) on both the top and the bottom faces thereof, and with a power source line and a ground line being installed inside the printed circuit board 14.

These memory ICs 11a–11d are generally fabricated in a package structure, which is formed in the following manner. First, bare IC chips with a monolithic structure are electrically connected to lead frames 15a–15d by a die bonding technique and a wire bonding technique. Then, the entire structure is encapsulated with a resin material so as to be packaged. The memory ICs 11a–11d thus fabricated are surface-mounted on the printed circuit board 14 by soldering the lead frames 15a–15d to external circuits such as signal wirings on the printed circuit board 14.

FIG. 2 shows an example of a circuit diagram of the internal memory circuit.

The memory ICs 11a–11d may typically be DRAMs. An address bus 12 and a data bus 13 are connected to each of the memory ICs 11a–11d. In addition, a group of signal lines 16 comprising a power source line Vss, a ground line GND, row address strobe signal lines (hereinafter, referred to as /RAS signal lines) /RAS-1 to /RAS-4, column address strobe signal lines (hereinafter, referred to as /CAS signal lines) /CAS-1 to /CAS-4, a write enable signal line (hereinafter, referred to as a /WE signal line) /WE and an output enable signal line (hereinafter, referred to as an /OE signal line) /OE is connected to each of the memory ICs 11a–11d.

As seen in FIG. 2, each of the memory ICs 11a–11d has one of the /RAS signal lines and one of the /CAS signal lines connected thereto. This is because the /RAS signal and the /CAS signal are signals to be input to each of the memory ICs 11a–11d for selecting one of them to be accessed. In order to access a particular memory IC, the /RAS signal and the /CAS signal are input selectively thereto. Furthermore, during an access operation, data is written in the memory IC upon receiving the /WE signal and recorded data is read from the memory IC upon receiving the /OE signal.

Meanwhile, one of strongly desired requirements of digital computers these days is an increase in the processing speed. One of the approaches to meet this requirement is to increase the memory capacity of the internal memory installed therein. The number of accesses to an external memory and the required time for the accessing procedure can be reduced by providing an internal memory with a large capacity, which makes it possible to achieve a higher processing speed.

In order to increase the memory capacity of the internal memory circuit, a number of memory ICs great enough to satisfy the requirement must be mounted on the printed circuit board 14. However, in the conventional internal memory circuit as shown in FIG. 1 wherein the memory ICs 11a–11d are surface-mounted on the printed circuit board 14 in one layer, increasing the number of memory ICs to be mounted on the printed circuit board leads to such problems as described below.

(1) Wirings connected to each of the memory ICs become longer, resulting in a greater wiring impedance. As a result, transmission characteristics of signals deteriorate, which makes high speed processing difficult.

(2) Increased length of the wirings further causes reflection of the signals at the terminating end of the wirings. Reflected signals distort the original signal waveforms which are propagating in the wirings. In FIG. 2, for example, the memory IC 11a connected to the signal wiring near the starting end thereof and the memory IC 11d connected to the wirings near the terminating end thereof have different access timings as well as input signals with different waveforms because of the interference with the reflected signals. To ensure reliable operations of the internal memory circuit under such conditions, the access timing margin must be increased. Consequently, high speed processing becomes difficult.

(3) As the number of the memory ICs to be mounted increases, a larger area of the printed circuit board 14 is required. Thus, an increased size of the apparatus is needed. Moreover, because the four-layered Cu-clad circuit board is relatively expensive, increasing the circuit board area means an increase in costs.

To help overcome The above problems, a multi-layered integrated memory circuit has been proposed wherein a plurality of memory IC chips or a plurality of memory modules which include a plurality of memory IC chips are stacked in layers on top of each other. Such a multi-layered integrated memory circuit can solve the space problems of the conventional surface-mounted memory circuits to a large extent.

However, new problems relating to the method of connecting the lead frame arise.

As described previously, each memory IC is provided with the address bus 12, the data bus 13 and the group of the signal lines 16 being connected thereto. On the other hand, in the conventional multilayered memory circuits, memory chips or memory modules are stacked while arranged in the same direction. Each of lead terminals which are located at corresponding locations in the lead frames of each of the memory chips or the memory modules is connected to each other and further connected to the same terminal pad on the printed circuit board. In such a case, a signal given to one lead terminal via one terminal pad is transmitted through the connected lead frames to all of the memory ICs or the memory modules in every layer of the multi-layered integrated memory circuit.

No problem related to the signal transmission arises even in such a wiring architecture as far as the terminals of the signals to be connected commonly to each memory IC are involved. On the other hand, the /RAS signal and the /CAS signal cannot be selectively transmitted to one particular layer in the multilayered structure of the above-mentioned simple stacking structure.

In order to solve the problem, such an arrangement requires the /RAS signal terminals and the /CAS signal terminals to be arranged at different positions in advance, depending on which layer the particular memory IC is to be mounted in. For example, The Japanese Laid-open Patent Publication No. 4-26152 and the U.S. Pat. No. 4,982,265 disclose the multilayered integrated memory circuits wherein memory IC chips having different configurations or arrangements of lead terminals are stacked in each layer.

However, such a circuit architecture suffers a disadvantage in that several kinds of the memory IC chips having different configurations and arrangements of the lead terminals must be manufactured depending on which layer they are to be mounted in. This may bring about an increase in the manufacturing costs.

In addition, with such an arrangement of the terminals, an additional manufacturing step must be conducted before the mounting process so as to check if the memory ICs to be mounted in each layer have the proper terminal arrangement as designated in the design and to reject improper memory IC chips. When the memory IC chips have been already encapsulated in a plastic package structure, the wirings inside the package cannot be checked visually and therefore must be checked in other ways, such as by means of electrical conduction test or the like. This may also cause the manufacturing costs to increase.

Japanese Patent Publication No. 5-14427 discloses another multi-layered integrated memory circuit capable of solving the above-mentioned problems to some extent. In the multi-layered integrated memory circuit device, independent lead terminals for selecting the IC chips to be accessed are formed in a branched shape in the outer lead portion in a number corresponding to the number of chips to be stacked, while remaining unseparated in the inner lead portion.

The independent lead terminals with such features make it possible to mass-produce the memory IC chips having the same structure in the same process irrespective of which layer they are to be mounted in. During the mounting process, all of the branches except one branch in the outer lead portion of the independent lead terminals are cut off, depending on which layer the chip is to be mounted in. This configuration makes it possible that signals can be transmitted selectively only to the memory IC chips or the memory modules in a particular layer.

However, in the above structure, a new step of fabrication, i.e. cutting off the unnecessary branches in outer leads, must be added. Thus, it still has points to be solved so as to improve the manufacturing efficiency and to reduce costs.

SUMMARY OF THE INVENTION

A semiconductor integrated circuit module of this invention includes: a wiring board having a first face and a second face; a plurality of semiconductor devices mounted on at least one of the first and the second faces of the wiring board; and a plurality of terminals formed along peripheral edges of the wiring board, the terminals along each of the peripheral edges being grouped into a terminal row so as to form a plurality of terminal rows, each of the plurality of terminal rows being electrically connected respectively to a different one of the plurality of semiconductor devices, wherein each of the plurality of terminal rows includes at least one specific terminal for transmitting a signal having a predetermined function, and a position of the specific terminal in each of the plurality of terminal rows is different from each other.

According to another aspect of the present invention, a semiconductor integrated circuit device of this invention includes a multilayer structure in which a plurality of modules are stacked, and each of the plurality of modules includes: a wiring board having a first face and a second face; a plurality of semiconductor devices mounted on at least one of the first and the second faces of the wiring board; and a plurality of terminals formed along peripheral edges of the wiring board, the terminals along each of the peripheral edges being grouped into a terminal row so as to form a plurality of terminal rows, each of the plurality of terminal rows being electrically connected respectively to a different one of the plurally of semiconductor devices, wherein each of the plurality of terminal rows includes at least one specific terminal for transmitting a signal having a predetermined function, and a position of the specific terminal in each of the plurality of terminal rows is different from each other.

In one embodiment, at least one of the plurality of semiconductor devices is a memory device.

In another embodiment, the signal is selectively input to one of the plurality of semiconductor devices.

In still another embodiment, each of the plurality of terminals in one of the plurality of modules is connected to other terminals at corresponding positions in the modules which are placed in upper and lower layers in the multilayer structure.

In still another embodiment, each of the plurality of modules in the multilayer structure are stacked after being rotated at a predetermined angle, whereby positions of the specific terminal in each of the plurality of terminal rows are shifted from each other among the terminal rows at corresponding positions of the modules which are placed in upper and lower layers in the multilayer structure.

In still another embodiment, the plurality of terminals have a rectangular shape.

Alternatively, the plurality of terminals of the plurality of modules except for a lowermost module in the multilayer structure have a rectangular shape, and the plurality of terminals of the lowermost module have a gull-wing shape.

In still another embodiment, a resistor module is further mounted as an uppermost module, wherein the resistor module includes a plurality of resistors mounted on a wiring board.

In still another embodiment, at least one capacitor is mounted on at least one of the first and the second faces of the wiring board.

In still another embodiment, the plurality of semiconductor devices are four semiconductor devices mounted in a square mounting area with an arrangement in which one of two longer edges of each of the four semiconductor devices and one of two shorter edges of the neighboring semiconductor device are located side by side. Preferably, at least one capacitor is mounted in the center portion of the square mounting area.

In still another embodiment, the wiring board has a regular polygonal shape having n number of vertexes, n being equal to or more than 3.

In still another embodiment, the plurality of semiconductor devices are a plurality of bare IC chips.

In still another embodiment, the plurality of semiconductor devices are a plurality of TAB packages, wherein each of the plurality of TAB packages includes: a film carrier; a bare IC chip being mounted on the film carrier; and outer leads formed along at least one of two longer edges of the film carrier, the outer leads being electrically connected to the bare IC chip.

Preferably, a plurality of the TAB packages are mounted on the wiring board, wherein two of the plurality of TAB packages are paired, the paired TAB packages being arranged in parallel so that each of the outer leads thereof points toward the peripheral edges of the wiring board, each of the outer leads being connected to respective outer lead pads arranged in a pair of parallel pad rows on the wiring board.

In still another embodiment, another paired TAB packages are stacked overlapping the paired TAB packages in a criss-cross method.

In still another embodiment, shorter edges of the bare IC chip of each of the plurality of TAB packages is shorter than a half an interval between the pair of parallel pad rows.

Preferably, at least one capacitor is mounted on a space between the pair of parallel pad rows.

Thus, the invention described herein makes possible the advantages of providing a semiconductor integrated circuit module and a semiconductor integrated circuit device which can be fabricated easily and efficiently without adding fabrication steps or increasing production costs.

In the semiconductor integrated circuit device of the present invention, distortion of signal waveforms is restrained to the minimum level because the wirings thereof are short. In addition, the reflection of the signals at the terminating end of the wirings can be avoided by further stacking a resistor module.

As a result, according to the present invention, it is possible to provide a small-size large-capacity memory circuit and to provide a digital computer with a high processing speed by using the same.

This and other advantages of the present invention will become apparent to those skilled in the art upon reading and understanding the following detailed description with reference to the accompanying figures.

BRIEF DESCRIPTION OF THE DRAWINGS

FIGS. 5A and 5B are schematic diagrams illustrating the method of stacking the semiconductor integrated circuit modules in accordance with the first example of the present invention.

DESCRIPTION OF THE PREFERRED EMBODIMENTS

Hereinafter, the present invention will be described by way of examples. In the following examples, the present invention is applied to a memory circuit. Therefore, in the following description, the semiconductor integrated circuit module and the semiconductor integrated circuit device of the present invention are referred to as a memory module and an integrated memory circuit device, respectively.

EXAMPLE 1

A first example of the invention will be described below.

Figure 1:
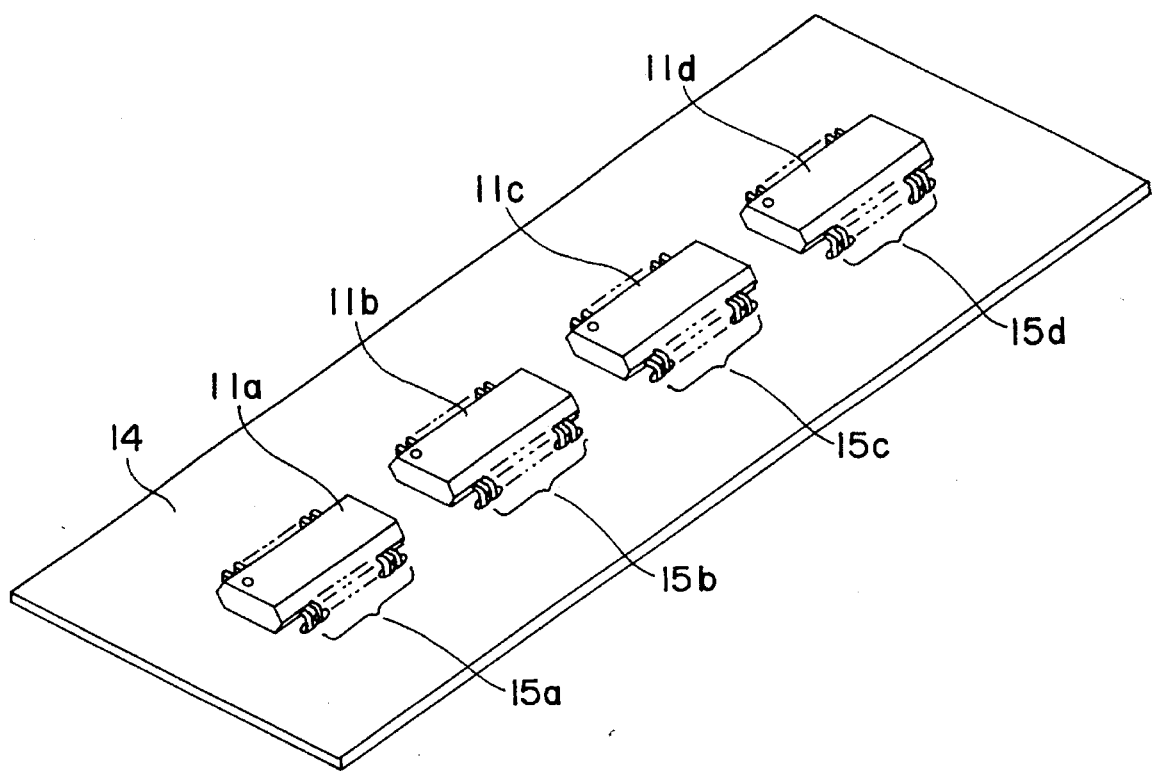
FIG. 1 is a perspective view illustrating an example of a conventional semiconductor integrated circuit wherein memory ICs are surface-mounted by soldering on a printed circuit board.
Figure 2:
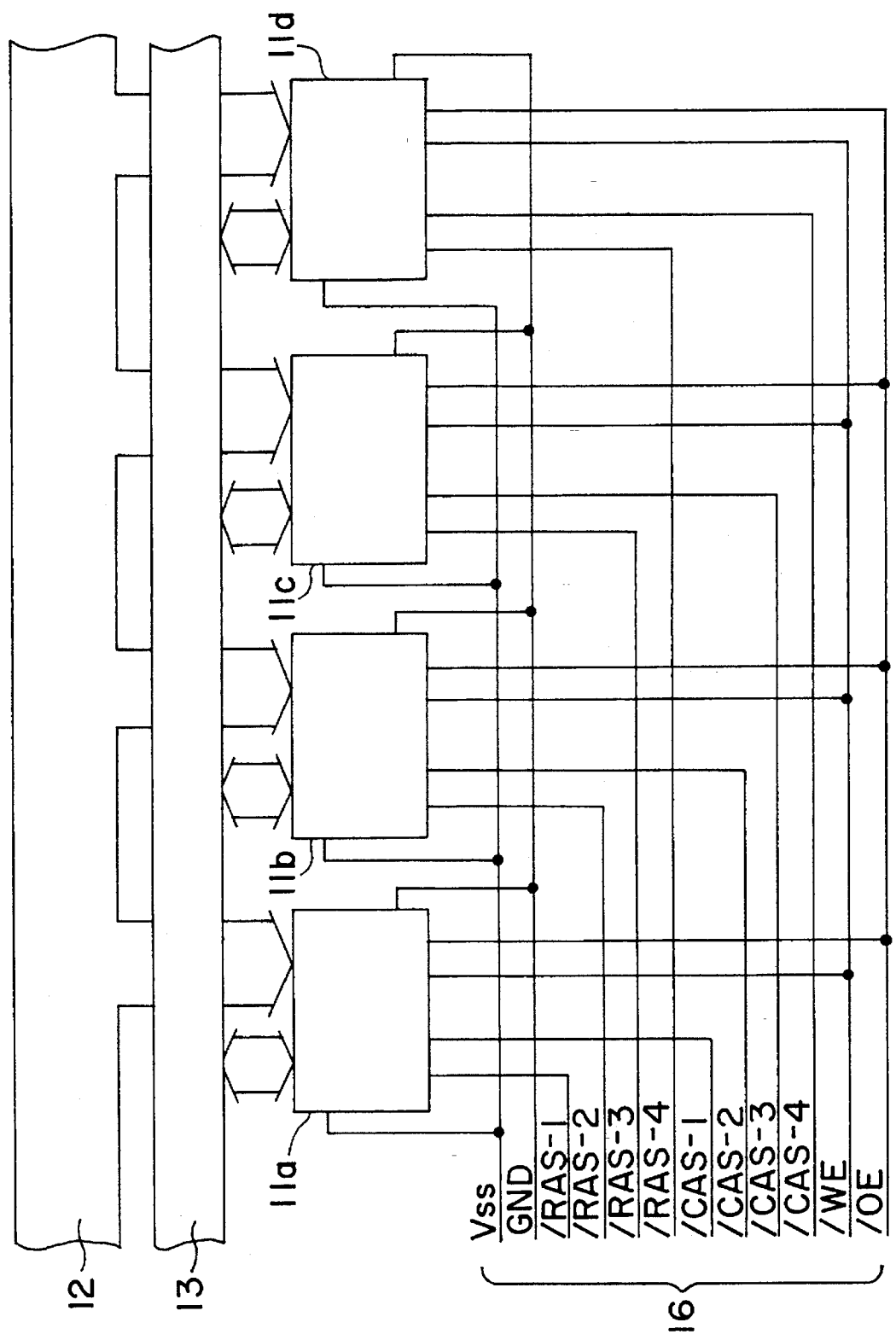
FIG. 2 is a circuit diagram of an internal memory circuit.
Figure 3:
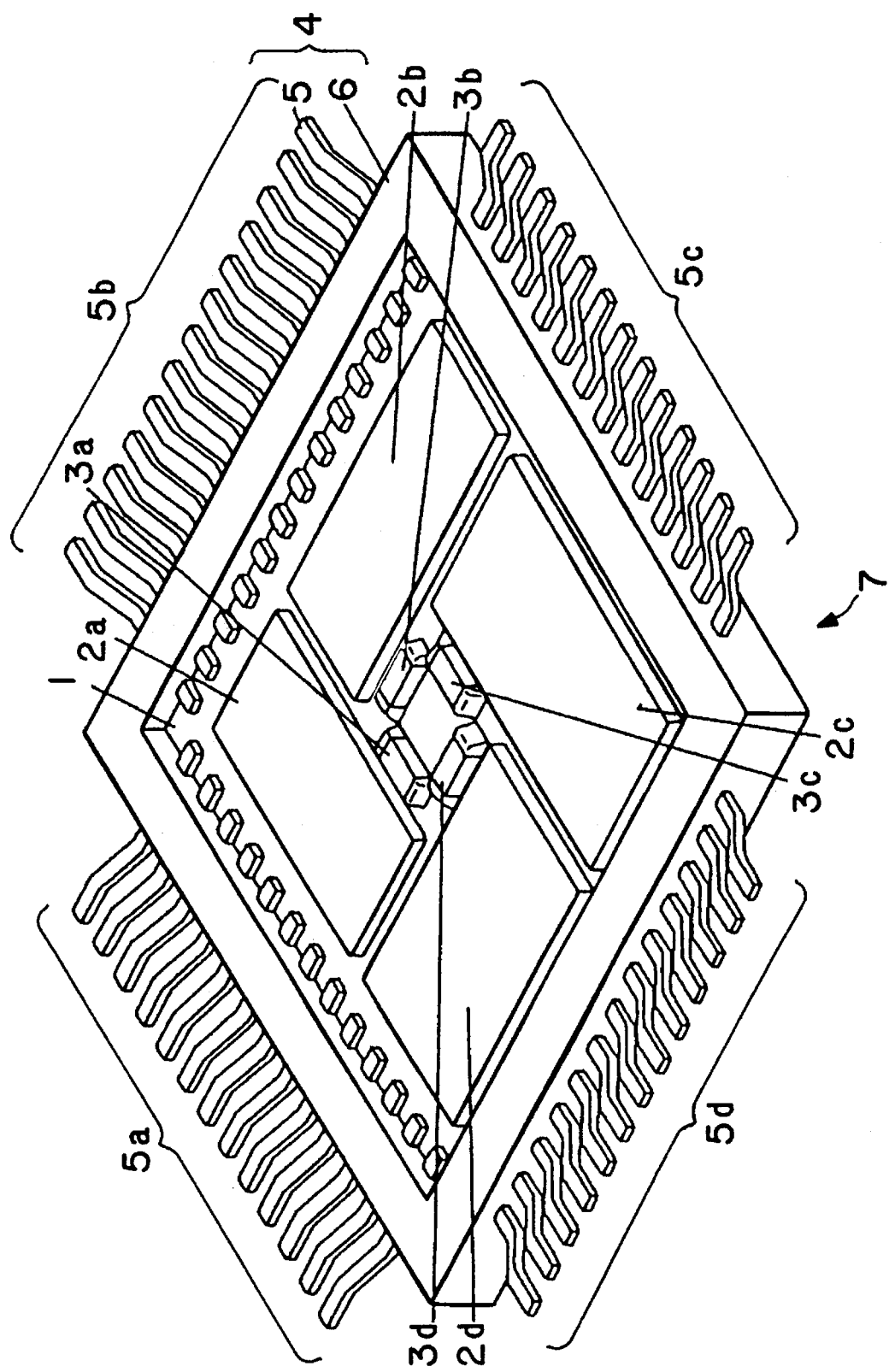
FIG. 3 is a perspective view illustrating a semiconductor integrated circuit module wherein bare memory IC chips are surface-mounted, which are used in a first example of an semiconductor integrated circuit device of the present invention.
Figure 4:
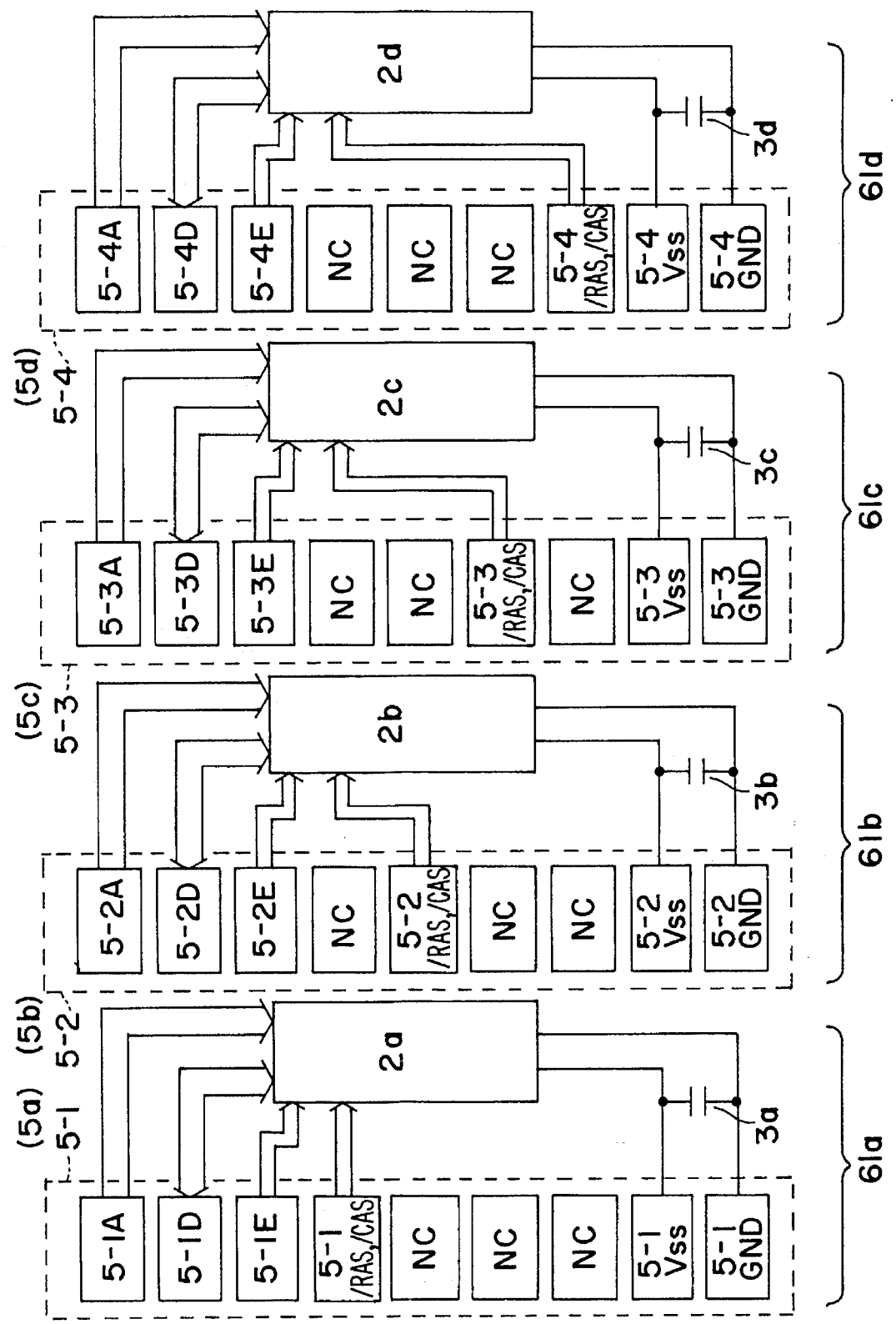
FIG. 4 is a circuit diagram of the semiconductor integrated circuit module shown in FIG. 3.

First, by referring to FIGS. 3 and 4, the configuration and the circuit of the memory module used in the integrated memory circuit device are explained.

FIG. 3 is a perspective view illustrating a memory module 7 wherein bare memory IC chips are mounted thereon.

On a wiring board 1, four bare memory IC chips 2a–2d and four surface-mount type chip capacitors 3a–3d (hereinafter, referred to as chip capacitors) are mounted. Lead frames 4 of such a structure as lead terminals 5 are supported by a support frame 6 are formed along the four peripheral edges of the wiring board 1. The size of the wiring board 1 is typically 24 mm×24 mm. The four bare memory IC chips 2a–2d and the four chip capacitors 3a–3d mounted on the wiring board 1 are connected to an external circuit via the lead terminals 5.

The chip capacitors 3a–3d are mounted so as to absorb a surge voltage. Each of them is connected to respective bare memory IC chips 2a–2d. Consequently, a pair comprising one of the bare memory IC chips 2a–2d and one of the chip capacitors 3a–3d forms one circuit on the memory module 7, which means that the total number of circuits on the memory module 7 is four. Each of these four circuits is further connected, without overlapping each other, to respective terminal rows 5a–5d of the lead terminals 5 arranged along the four edges of the memory module 7.

For the bare memory IC chips 2a–2d and the chip capacitors 3a–3d, conventional ones can be used. The wiring board 1 and the lead frames 4 may also be conventional ones which are manufactured from known materials in known manufacturing processes so detailed description thereof will be omitted.

FIG. 4 is a circuit diagram of the memory module 7 as shown in FIG. 3.

As described previously, there are four circuits 61a–61d of the same construction on the memory module 7. Each of these circuits 61a–61d includes one of the bare memory IC chips 2a–2d and one of the chip capacitors 3a–3d, and is connected to the respective terminal rows 5a–5d which are arranged along the four peripheral edges of the memory module 7 as shown in FIG. 3. Each of the terminal rows 5a–5d has respective terminal arrangements 5-1–5-4, as shown in FIG. 4.

In the terminal arrangements 5-1–5-4 of the terminal rows 5a–5d, power source terminals 5-1Vss–5-4Vss, ground terminals 5-1GND–5-4GND, address bus terminals 5-1A–5-4A, data bus terminals 5-1D–5-4D, and enable terminals for a /WE signal and a /OE signal 5-1E–5-4E are allocated at the respective corresponding positions. These terminals transmit signals which are to be input commonly to the circuits 61a–61d.

On the other hand, the group of /RAS signal terminals and /CAS signal terminals 5-1/RAS, /CAS–5-4/RAS, /CAS are allocated as follows so as not to overlap each other in the respective terminal rows 5a–5d. In the terminal arrangement 5-1 of the first circuit 61a, the terminals are allocated in the order as a /RAS and /CAS terminal, an NC (non-contact) terminal, an NC terminal and an NC terminal. The NC terminal here means a lead terminal which is not connected to the bare memory IC chip 2a at all. Therefore, a signal given to this NC terminal has no effect on the first circuit 61a in the memory module 7.

In the terminal arrangement 5-2 of the second circuit 61b, the terminals are allocated in the order as an NC terminal, a /RAS and /CAS terminal, an NC terminal and an NC terminal. That is, in the terminal arrangement 5-1 of the first circuit 61a and the terminal arrangement 5-2 of the second circuit 61b, the positions of the /RAS and /CAS terminals are shifted from each other.

Similarly, in the terminal arrangement 5-3 of the third circuit 61c, the terminals are allocated in the order as an NC terminal, an NC terminal, an /RAS and /CAS terminal and an NC terminal, and in the terminal arrangement 5-4 of the fourth circuit 61d, the terminals are allocated in the order as an NC terminal, an NC terminal, an NC terminal and a /RAS and /CAS terminals.

As described above, in the memory module 7 used in the integrated memory circuit device of the present invention, the terminals for signals which are commonly input/output to/from all circuits are allocated at the respective corresponding positions in each of the terminal arrangements 5-1–5-4 connected to the respective four circuits 61a–61d, while the terminals for signals which are selectively input/output to/from a particular circuit are allocated at shifted positions from each other.

Next, a method of stacking and electrically connecting a plurality of the memory modules 71–74 will be described below with reference to FIGS. 5A and 5B. Four memory modules 71–74 are used here, each of which have the same structure and the same circuit as described in FIGS. 3 and 4.

Since the four memory modules, from the lowermost one 71 to the uppermost one 74, are of the same structure, all of the terminal rows at corresponding positions have the same terminal arrangements. For example, terminal rows 5-1-1, 5-2-1, 5-3-1 and 5-4-1 in FIG. 5A have the same terminal arrangement. As a result, simply stacking the memory modules 71–74 Causes the terminal rows of the same terminal arrangement to overlap each other. This brings the same disadvantage as that of the conventional multi-layered integrated memory circuits as previously described.

Thus, in the present invention, each of the memory modules 71–74 in each layer are rotated clockwise 90°, 180° or 270° and then stacked in order, as shown in FIG. 5B. As a result, on the terminal rows 5-1-1 of the lowermost memory module 71, the terminal rows 5-2-4, 5-3-3 and 5-4-2 having different terminal arrangements are stacked successively, and are connected to each other.

Figure 6:
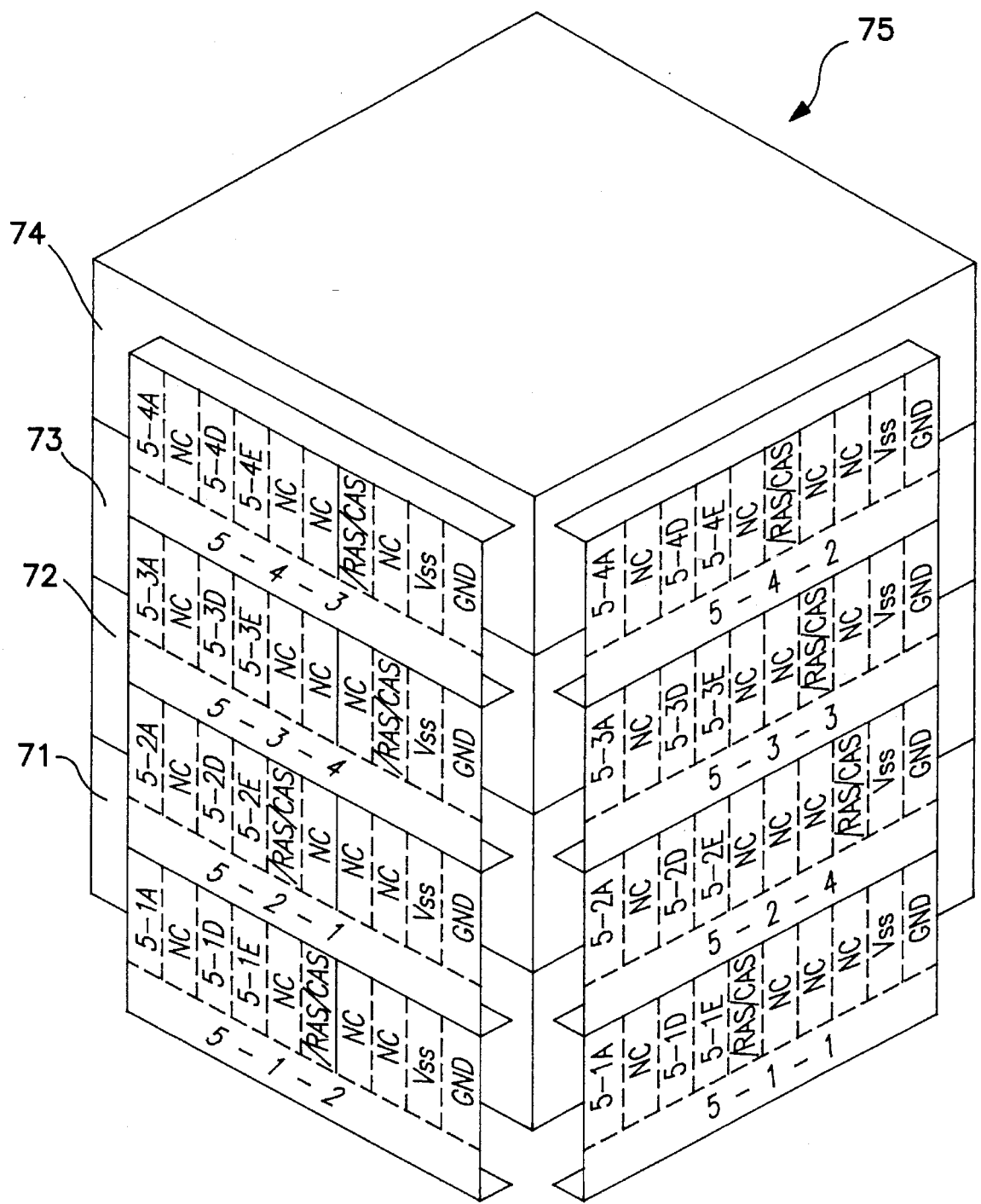
FIG. 6 is a schematic illustration showing the arrangements of the lead terminals in each layer in the first example of the semiconductor integrated circuit device of the present invention.

FIG. 6 schematically shows the terminal arrangements in each layer of a memory module block 75 fabricated by overlapping the memory modules 71–74 as described above. In the memory module block 75, the power source terminals Vss, the ground terminals GND, the address bus terminals 5-1A–5-4A, the data bus terminals 5-1D–5-4D, and the enable terminals for the /WE signal and the /OE signal 5-1E–5-4E are allocated at respective corresponding positions in all four layers and are connected to each other, respectively.

On the other hand, each of the /RAS signal terminals and the /CAS signal terminals is connected only to the NC terminals in upper and lower layers. Since the NC terminals are not connected to the circuit in the memory module as previously described, each of the /RAS signal terminals and of the /CAS signal terminals is connected independently to each of the four memory IC chips mounted in the memory module in each layer, i.e. 16 memory IC chips in all.

Next, with reference to FIG. 7, the configuration of the lead terminals of the stacked memory modules and the connection therebetween will be described below.

Figure 7:
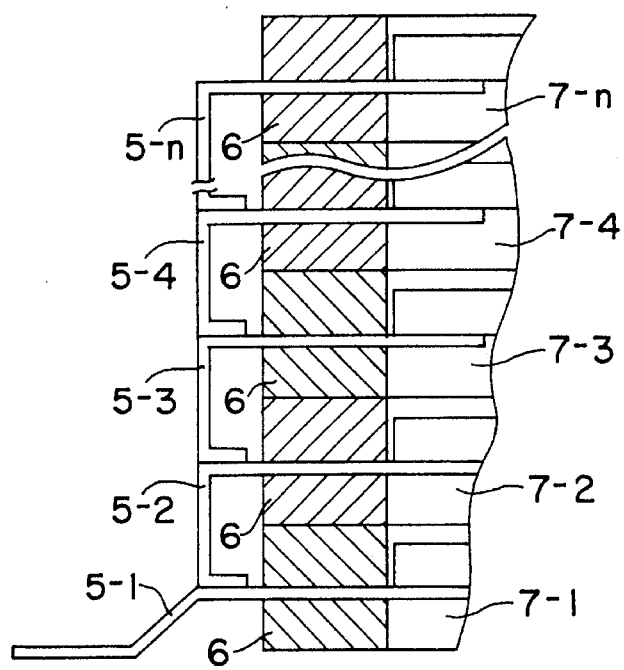
FIG. 7 is a schematic illustration showing the configuration of the lead terminals and the connection therebetween in the first example of the semiconductor integrated circuit device of the present invention.

FIG. 7 illustrates the connection among the lead terminals 5-1-5-n of the stacked memory modules (n pieces) 7-1-7-n. The lead terminals 5-1-5-n of each of the memory modules 7-1-7-n are supported by support frames 6, which have the same configuration and are made of the same material as each other.

In FIG. 7, the lead terminal 5-1 of the lowermost memory module 7-1 has a gull-wing shape spreading outward and is connected to a terminal pad on the wiring board (not shown) by soldering. On the other hand, the lead terminals 5-2-5-n of the other memory modules 7-2-7-n are fabricated so as to have a rectangular bracket-shape and are stacked so as to be connected to each other by soldering.

As seen in FIG. 7, in this memory module block, the lead terminals of each layer can be stably connected to each other through a flat contacting area therebetween. In addition, the expansion of the contacting area is easily realized by extending the length of the bent portion of each of the lead terminals. This extension makes it possible to increase both the electrical stability and the mechanical strength of the connection.

Furthermore, the lead terminals with the rectangular bracket-shape, which is bent inward as shown in FIG. 7, have an additional advantage of only being slightly distorted by mechanical impact. As a result, the designed value of the contacting area is less likely to be reduced, which is one of the beneficial factors for achieving a stable connection between the lead terminals.

The lead terminal 5-1 of the lowermost memory module 7-1 may have The same rectangular bracket-shape as the others. This means that all memory modules to be stacked have lead terminals of the same shape, which improves efficiency in fabrication. For example, in the integrated memory circuit device as shown in FIG. 6, four memory modules in four layers have the lead frames of the same rectangular bracket-shape.

By using the memory modules and the memory module blocks which have the above mentioned features, some additional circuits may be added to the integrated memory circuit device of the present invention.

For example, with reference to FIGS. 8A–8C, adding a resistor module as the uppermost layer to the integrated memory circuit device will be explained below.

Figures 8A, 8B, 8C:
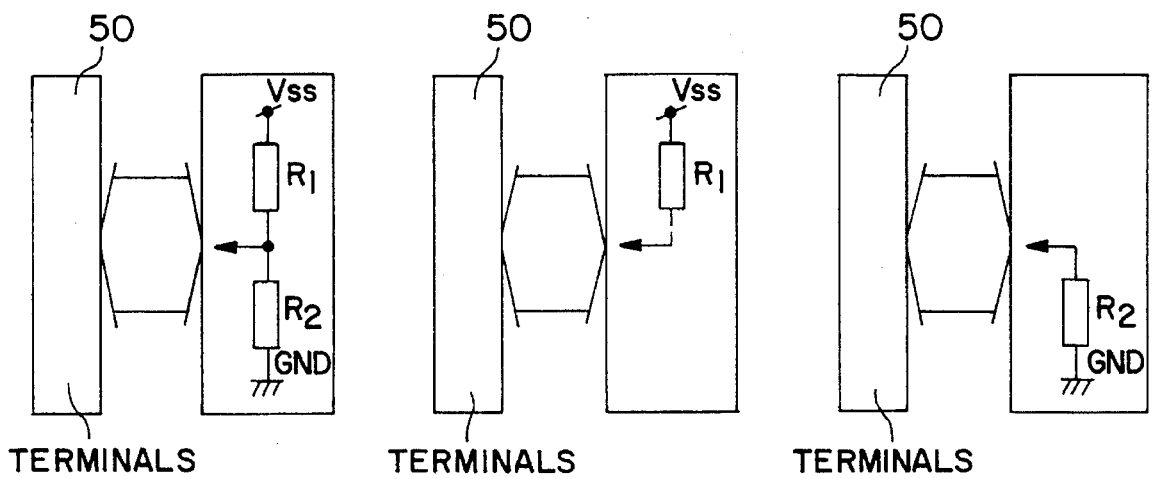
FIGS. 8A, 8B and 8C are schematic illustrations showing circuit diagrams of resistor modules connected to the semiconductor integrated circuit device of the present invention.

The resistor module here is a module which has a plurality of resistors mounted on a wiring board so that a predetermined resistor is connected between the power source terminals and/or the ground terminals and groups of other terminals such as the address bus terminals, the data bus terminals, the enable signal terminals and the /RAS and /CAS signal terminals (in FIGS. 8A–8C, they are referred to as "terminals" 50 correctively).

For example, FIG. 8A is a schematic circuit diagram of the resistor module in which a pull-up resistor R1 is connected between the power source terminals Vss and the terminals 50, and a pull-down resistor R2 is connected between the terminals 50 and the ground terminals GND. Similarly, FIGS. 8B and 8C are circuit diagrams of the resistor modules in which either the pull-up resistor R1 or the pull-down resistor R2 is connected between the terminals 50 and either the power source terminals Vss or the ground terminals GND.

Connecting these resistor modules as the uppermost layer to the integrated memory circuit device leads to a structure wherein each line of the wirings has a terminal resistor connected to it. Because this arrangement is capable of preventing the reflection of signals at the terminating end of the wirings, it is possible to set a smaller time margin for the input/output operations to/from each of the memory ICs, resulting in an increased higher operation speed of the digital computer.

Although in the above description, four bare memory IC chips are mounted on one memory module 7 and four memory modules 7 are stacked, the number of the memory IC bare chips or the number of the memory modules to be stacked are not limited to 4. In addition, the shape of the wiring board is not limited to a square, but may be any regular polygon.

EXAMPLE 2

Next, an integrated memory circuit device in a second example of the present invention will be explained with reference to FIGS. 9 and 6. In this example, two memory module blocks, each of which has four memory modules, are stacked so as to achieve an extended function.

Figure 9:
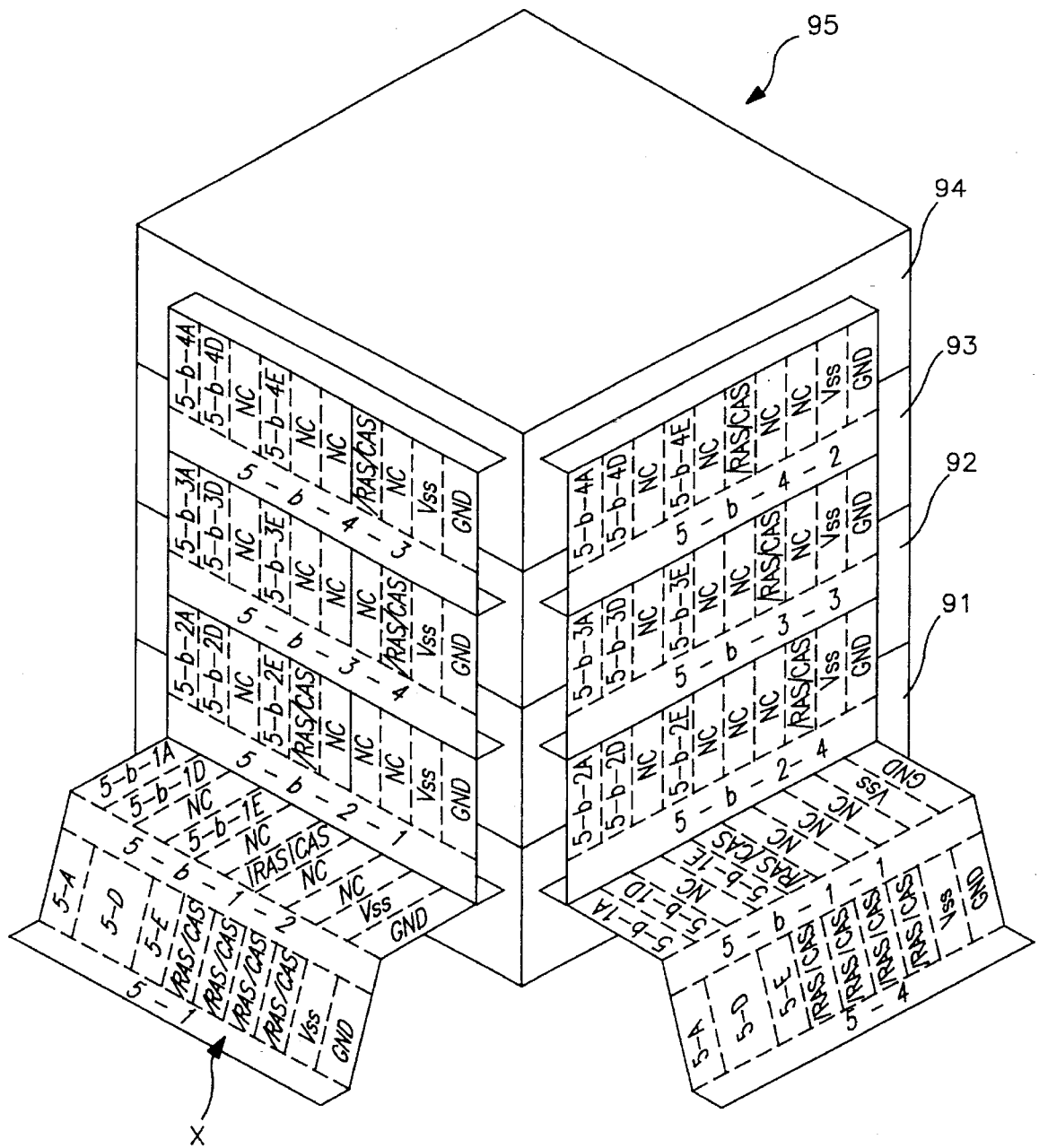
FIG. 9 is a schematic illustration showing the arrangements of the lead terminals in each layer of the memory block used to expand data bus lines in a second example of the semiconductor integrated circuit device of the present invention.

More particularly, on a lower module block 95 as shown in FIG. 9, the memory module block 75 as shown in FIG. 6 (hereinafter, referred to as an upper memory module block) is stacked so as to extend the data bus line. The arrangements of the lead terminals for achieving the above advantage will be described below.

Each of the upper and the lower memory module blocks 75 and 95 have four memory modules 71–74 and 91–94 being stacked. Accordingly, by stacking the upper and the lower memory module blocks 75 and 95, an integrated memory circuit device with eight layers is formed.

The structure and the terminal arrangements of the upper memory module block 75 have been already described with reference to the first example. The lower memory module block 95 has similar features as the upper memory module block 75.

The lower memory module block 95 is formed by stacking four memory modules 91–94 having the same structure after rotating each of them clockwise by 90°, 180° or 270°, respectively. As a result, the terminals for signals which are to be commonly input to each of the memory modules 91–94 in each layer such as the power source terminals Vss and the ground terminals GND are allocated at the respective corresponding positions, while the /RAS signal terminals and the /CAS signal terminals are allocated so as not to be located overlapping with each other among the memory modules 91–94. This makes it possible to input the /RAS signal and the /CAS signal selectively to the memory module in a particular layer in the lower memory module block 95, similarly as in the upper memory module block 75.

The structural difference between the upper and the lower memory module blocks 75 and 95 is in that the positions of the data bus terminals are shifted from each other between the lower memory module block 95 and the upper memory module block 75. As a result, the data bus terminals are located so as not to overlap each other between the upper and the lower memory module blocks 75 and 95.

In the case as shown in FIGS. 6 and 9, the data bus terminals of the lower memory module block 95 are the second terminals from the left end of each terminal rows (labelled as, for example, 5-*b*-1D), while the data bus terminals of the upper memory module block 75 are the third terminals from the left end of each terminal rows (labelled as, for example, 5-1D). Thus, terminals of the upper memory module block 75 located at positions corresponding to those of the data bus terminals of the lower memory module block 95 are NC terminals, and vice versa.

As a result, in the integrated memory circuit device in this example, the data bas line can be considered to be expanded, although the data width of each of the memory modules is the same as that in the first example. The reasons are as follows.

When a signal is input to one of the /RAS signal terminals and the /CAS signal terminals, one layer of the upper memory module block 75 and one layer of the lower memory module block 95 are accessed simultaneously.

For example, when a signal is input to the terminal indicated by an "X" (see an arrow in FIG. 9), at the fourth lead terminal from the right end, the uppermost memory modules 74 and 94 are accessed in the upper and the lower memory module blocks 75 and 95, respectively. Each of the data bus of the upper and the lower memory module blocks 75 and 95 are independently connected to an external circuit on a wiring board (not shown). As a result, the data from the upper memory module block 75 and the data from the lower memory module block 95 are added and output to the external circuit. This is equivalent to an expansion of the data bus line.

Therefore, according to this example of the present invention, the expansion of the data bus line can be easily achieved without major changes in design of the memory circuits.

EXAMPLE 3

In the first and the second examples described so far, bare memory IC chips are used. In a third example to be described below, TAB packages are used wherein bare memory IC chips are mounted on a film carrier.

Figure 10:
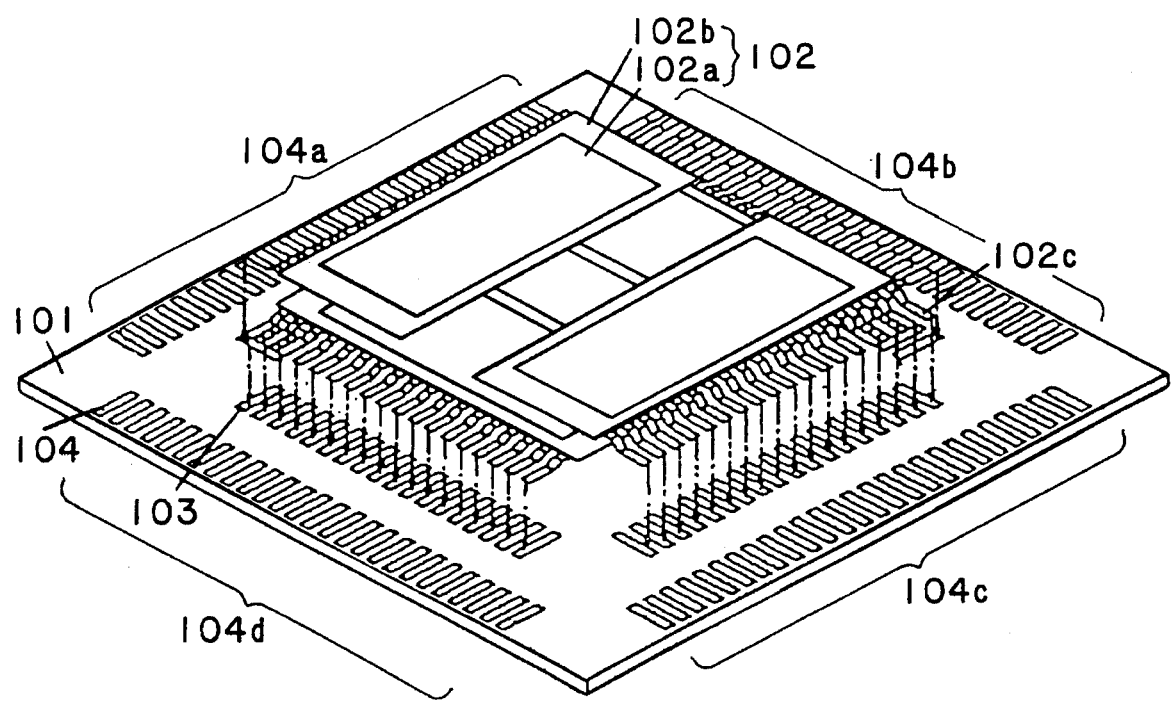
FIG. 10 is a perspective view illustrating the top face of a wiring board in a third example of the semiconductor integrated circuit device of the present invention.

FIG. 10 shows a perspective view illustrating the top face of a wiring board in this example.

A TAB package 102 to be mounted has such a structure that a bare memory IC chip 102a is mounted on a rectangular film carrier 102b. Outer leads 102c are formed along one of longer edges of the film carrier 102b. The bare memory IC chip 102a and the outer leads 102c are electrically connected to each other by means of inner leads (not shown in FIG. 10) formed on the film carrier 102b. The size of the TAB package 102 is typically 16 mm×7 mm.

On a square wiring board 101, terminal pads 104 in the form of strips in parallel are formed along the four peripheral edges. Outer lead connection pads 103 are arranged in the inner portion of the terminal pads 104 on the wiring board 101. The terminal pads 104 are formed along the respective four peripheral edges of the wiring board 101 so as to form a plurality of terminal pad rows 104a–104d.

The outer leads 102c of the TAB package 102 and the outer lead connection pads 103 on the wiring board 101 are electrically connected to each other. The outer lead connection pads 103 is selectively connected by wirings (not shown) provided on the wiring board 101 to respective terminal pads 104. A plurality of TAB packages 102 are mounted on the wiring board 101.

Figure 11:
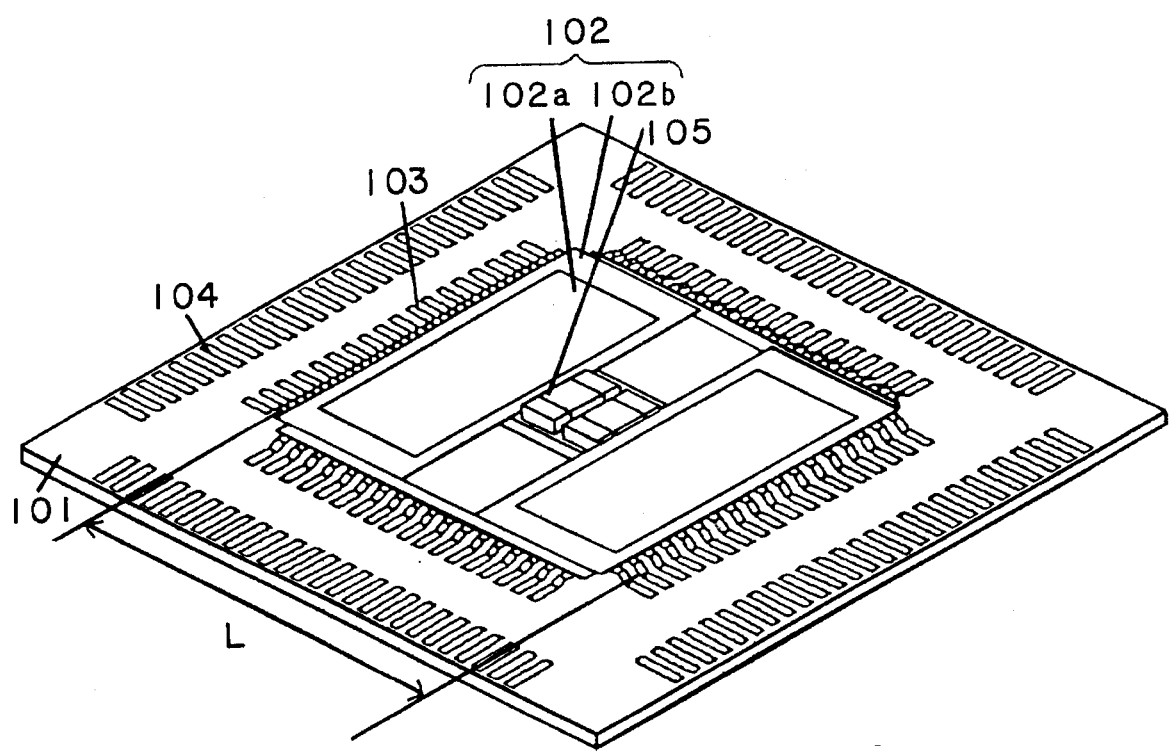
FIG. 11 is another perspective view illustrating the top face of the wiring board in the third example of the semiconductor integrated circuit device of the present invention.

FIG. 11 shows another perspective view illustrating the top face of the wiring board in this example. As shown in FIG. 11, chip capacitors 105 are further mounted on the wiring board 101, similar to the first example. These chip capacitors 105 are mounted in the space between the TAB packages 102 on the wiring board 101.

In this example, one chip capacitor 105 is connected to a pair of two TAB packages 102. However, the number of the chip capacitors 105 is not limited to the above. For example, one chip capacitor 105 may be provided for each TAB package 102. Alternatively, one chip capacitor may be placed on both the top and the bottom faces of the wiring board 101 respectively so that the chip capacitors 105 are respectively connected to the four TAB packages 102.

While the mounted configuration on the top face of the wiring board 101 has been described above, the bottom face thereof also has the same configuration. Consequently, one wiring board 101 of the integrated memory circuit device in this example has eight TAB packages 102 in total mounted on the top and the bottom faces thereof. Alternatively, both the top and the bottom faces of the wiring board 101 do not have to always be used for mounting, as only one of the two faces need be used.

Shorter edges of the bare memory IC chip 102a included in the TAB package 102 are preferably shorter than half of the interval (L in FIG. 11) between the opposed rows of the outer lead connection pads 103 provided on the wiring board 101. This intends to make it easy to mount the chip capacitors 105 by increasing the empty space between the pair of the TAB packages 102.

The TAB packages in this example can be fabricated using well-known materials in well-known processes, which are not described in detail here.

Although the TAB packages in this example have the outer leads arranged along only one of two longer edges of the tape carrier, the dual-in type TAB packages having the outer leads along both the two longer edges of the tape carrier may be used instead.

Furthermore, although it has been assumed that the wiring board 101 has a square shape in this example, it may be shaped in any regular polygon.

Next, the structure and the circuit of the memory module used in this example will be described with reference to FIGS. 12 and 13.

Figure 12:
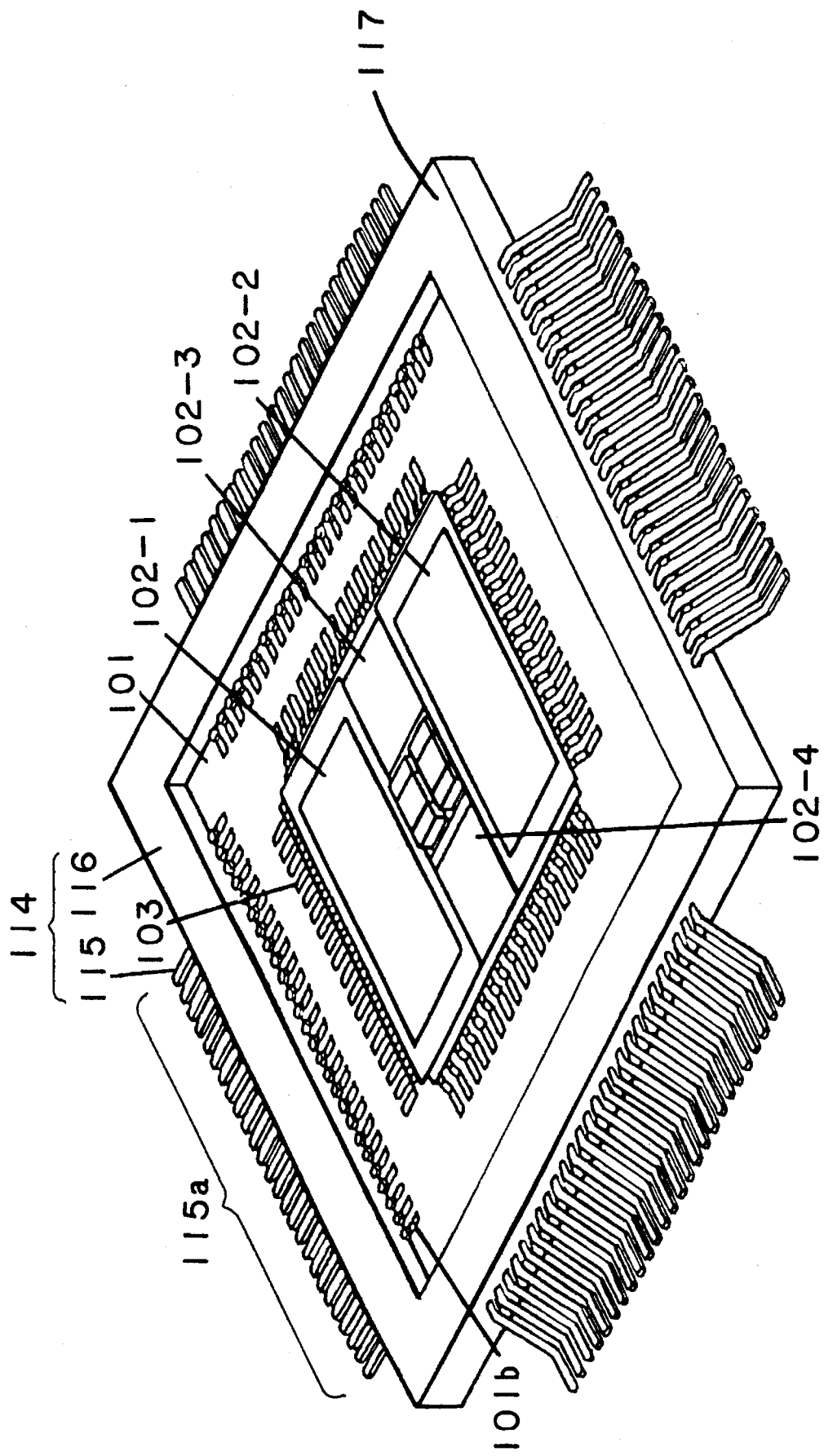
FIG. 12 is a perspective view illustrating a semiconductor integrated circuit module used in the third example of the semiconductor integrated circuit device of the present invention.

FIG. 12 shows a perspective view of a memory module 117 formed by using the wiring board 101 described in FIGS. 10 and 11. Lead frames 114 having a structure in which the lead terminals 115 are held by a support frame 116 are installed around the wiring board 101. Each of the lead terminals 115 of the lead frames 114 is electrically connected to the respective terminal pads (not shown in FIG. 12, see FIG. 10 or 11) on the wiring board 101. As a result, the bare memory IC chip in each of the TAB packages 102-1–102-4 mounted on the wiring board 101 can be connected electrically to an external circuit via the lead frames 114.

As described in conjunction with FIGS. 10 and 11, a plurality of the TAB packages 102 are mounted on the top face of the wiring board 101. For example, in an example as shown in FIG. 12, four TAB packages 102-1–102-4 are mounted thereon. Every two TAB packages make a pair. Each of the paired TAB packages are arranged and mounted in parallel in such a direction that the outer leads 102c of each of the paired TAB packages points outward to the peripheral edges of the wiring board 101.

Furthermore, another pair of TAB packages are mounted as overlapped over the paired TAB packages. In the example as shown in FIG. 12, over the paired TAB packages 102-3 and 102-4, another paired TAB packages 102-1 and 102-2 overlaps and are mounted in a criss-cross method. Thus, the required area for mounting can be reduced.

In addition, other four TAB packages 202-1–202-4 (not shown) are similarly mounted on the bottom face of the memory module 117.

Figure 13:
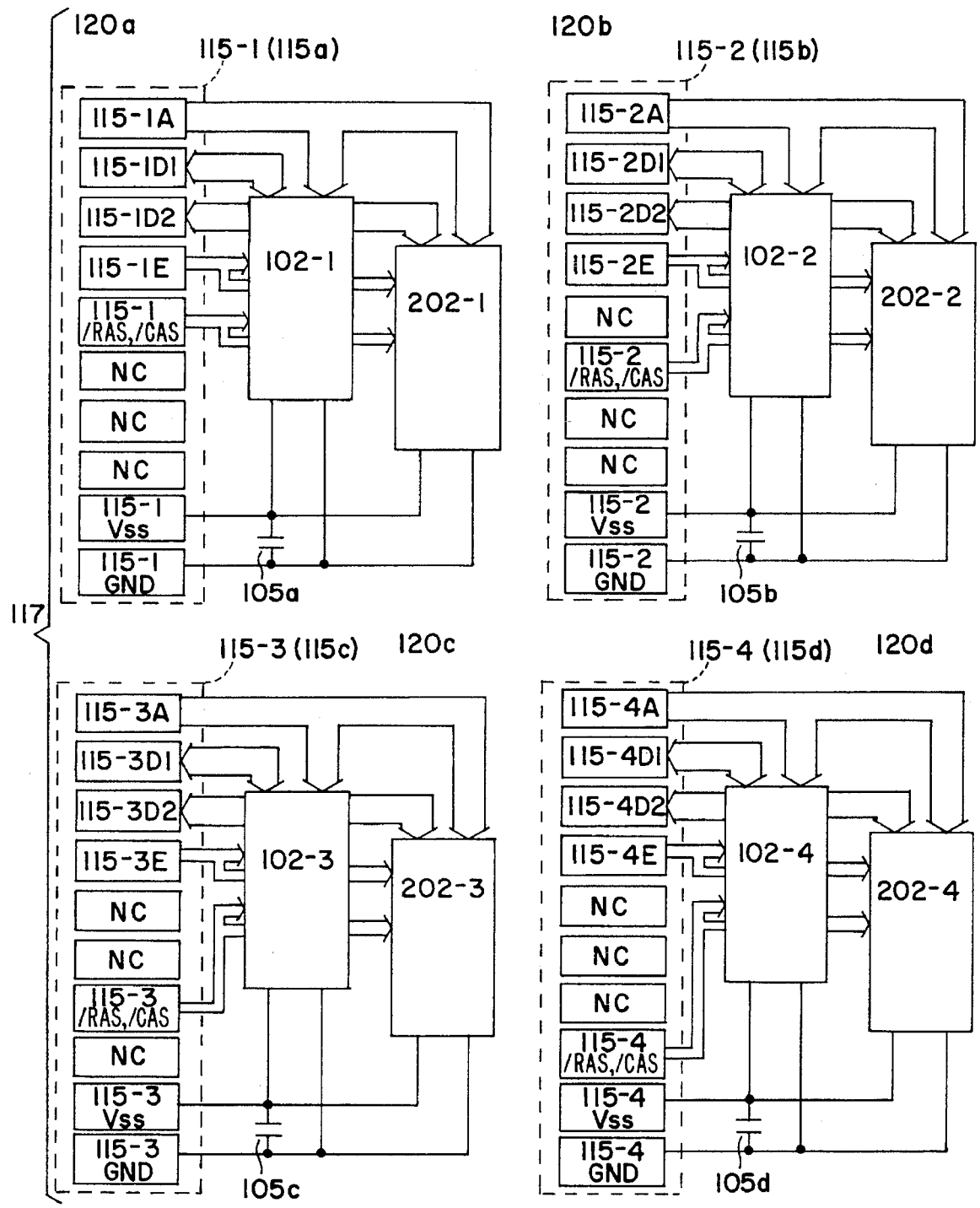
FIG. 13 is a circuit diagram of the semiconductor integrated circuit module shown in FIG. 12.

FIG. 13 shows a circuit diagram of the memory module 117 as shown in FIG. 12.

As is already described, the integrated memory circuit device of this example has a total of eight TAB packages 102 mounted on the top and the bottom faces of the wiring board 101. Among these TAB packages, any two are connected to each other so as to make one circuit. Therefore, one memory module 117 in this example has four circuits 120a–120d in total, similarly to the first example of the invention. Each circuits 120a–120d includes one chip capacitor 115a–115d for absorbing a surge voltage.

In the example as shown in FIG. 13, one of the TAB packages 102-1–102-4 mounted on the top face of the wiring board 101 and one of the TAB packages 202-1–202-4 mounted on the bottom face of the wiring board 101 are connected to each other so as to form one circuit. Alternatively, two of the TAB packages mounted on the same face of the wiring board 101 (for example, TAB packages 102-1 and 102-2) may be connected to each other so as to form one circuit.

Each of the circuits 120a–120d is selectively connected to the respective lead terminal rows 115a–115d which are formed along the four peripheral edges of the wiring board 101. The features described with reference to FIG. 4 in relation to the first example are also applied to the terminal arrangements 115-1–115-4 of these lead terminal rows 115a–115d. Namely, the terminals to be connected to all circuits in common such as the power source terminals 115-1Vss–115-4Vss and the ground terminals 115-1GND–115-4GND are allocated at the respective corresponding positions in each of the terminal arrangements 115-1–115-4. On the other hand, the terminals for the /RAS signal and the /CAS signal to be input selectively to a selected circuit are allocated at such positions so they do not overlap in each of the terminal arrangements 115-1–115-4.

In the terminal rows 115a–115d, one data bus terminal 115-1D1, 115-1D2–115-4D1, 115-4D2 is provided for each of two TAB packages included in every circuit 120a–120d. On the other hand, the terminals for the /RAS signal and the /CAS signal are connected commonly to both of the two TAB packages included in every circuit 120a–120d. As a result, accessing to one of the /RAS and the /CAS terminals leads to simultaneous accessing to both of two TAB packages included in the circuit which corresponds to the accessed terminal arrangement. Therefore, a similar effect of expanding the width of data to be input/output at substantially twofold can be obtained.

As described above, the TAB packages are used in this example, differently from the first and the second examples. However, all the effects of the invention described in relation to the first and the second examples (not repeatedly explained here so as to avoid redundancy) can be taken advantage of in this example, by forming the memory modules with the features of the structure, the circuit and the terminal arrangements as illustrated in FIG. 12 and FIG. 13.

In the above description, the semiconductor integrated circuit module and the semiconductor integrated circuit device of the present invention are explained by way of the internal memory circuit as the examples. However, the present invention can be applied to other semiconductor circuit devices having different functions such as logical operations and so on. U.S. Pat. No. 5,346,402 (issued to Yasuho et al.) describes an electronic circuit device in which semiconductor elements, resistors, capacitors are packaged onto an insulating substrate as a ceramic substrate.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor integrated circuit device comprising a multilayer structure in which a plurality of modules are stacked, each of said plurality of modules comprising:

a wiring board having a first face and a second face;

a plurality of semiconductor devices mounted on at least one of said first and said second faces of said wiring board; and a plurality of terminals formed along peripheral edges of said wiring board, the terminals along each of said peripheral edges being grouped into a terminal row so as to form a plurality of terminal rows, each of said plurality of terminal rows being electrically connected respectively to a different one of said plurality of semiconductor devices, wherein each of said plurality of terminal rows comprises at least one specific terminal for transmitting a signal having a predetermined function, and a position of said specific terminal in each of said plurality of terminal rows is different from each other.

2. An integrated circuit device according to claim 1, wherein at least one of said plurality of semiconductor devices is a memory device.

3. An integrated circuit device according to claim 1, wherein said signal is selectively input to one of said plurality of semiconductor devices.

4. An integrated circuit device according to claim 1, wherein each of said plurality of terminals in one of said plurality of modules is connected to other terminals at corresponding positions in the modules which are placed in upper and lower layers in said multilayer structure.

5. An integrated circuit device according to claim 1, wherein each of said plurality of modules in said multilayer structure are stacked after being rotated at a predetermined angle, whereby positions of said specific terminal in each of said plurality of terminal rows are shifted from each other among the terminal rows at corresponding positions of the modules which are placed in upper and lower layers in said multilayer structure.

6. An integrated circuit device according to claim 1, wherein said plurality of terminals have a rectangular shape.

7. An integrated circuit device according to claim 1, wherein said plurality of terminals of said plurality of modules except for a lowermost module in said multilayer structure have a rectangular shape, and said plurality of terminals of said lowermost module have a gull-wing shape.

8. An integrated circuit device according to claim 1 further comprising a resistor module as an uppermost module, wherein said resistor module comprises a plurality of resistors mounted on a wiring board.

9. An integrated circuit device according to claim 1, wherein at least one capacitor is mounted on at least one of said first and said second faces of said wiring board.

10. An integrated circuit device according to claim 1, wherein said plurality of semiconductor devices are four semiconductor devices mounted in a square mounting area with an arrangement in which one of two longer edges of each of said four semiconductor devices and one of two shorter edges of the neighboring semiconductor device are located side by side.

11. An integrated circuit device according to claim 10, wherein at least one capacitor is mounted in the center portion of said square mounting area.

12. An integrated circuit device according to claim 1, wherein said wiring board has a regular polygonal shape having n number of vertexes, n being equal to or more than 3.

13. An integrated circuit device according to claim 1, wherein said plurality of semiconductor devices are a plurality of bare IC chips.

14. An integrated circuit device according to claim 1, wherein said plurality of semiconductor devices are a plurality of TAB packages, wherein each of said plurality of TAB packages comprises:

a film carrier;

a bare IC chip being mounted on said film carrier; and outer leads formed along at least one of two longer edges of said film carrier, said outer leads being electrically connected to said bare IC chip.

15. An integrated circuit device according to claim 14 comprising a plurality of said TAB packages mounted on said wiring board, wherein two of said plurality of TAB packages are paired, said paired TAB packages being arranged in parallel so that each of said outer leads thereof points toward said peripheral edges of said wiring board, each of said outer leads being connected to respective outer lead pads arranged in a pair of parallel pad rows on said wiring board.

16. An integrated circuit device according to claim 15, wherein other paired TAB packages are stacked overlapping said paired TAB packages in a criss-cross method.

17. An integrated circuit device according to claim 15, wherein shorter edges of said bare IC chip of each of said plurality of TAB packages is shorter than a half of an interval between said pair of parallel pad rows.

18. An integrated circuit device according to claim 15, wherein at least one capacitor is mounted on a space between said pair of parallel pad rows.

19. A semiconductor integrated circuit module comprising:

a wiring board having a first face and a second face;

a plurality of semiconductor devices mounted on at least one of said first and said second faces of said wiring board; and a plurality of terminals formed along peripheral edges of said wiring board, the terminals along each of said peripheral edges being grouped into a terminal row so as to form a plurality of terminal rows, each of said plurality of terminal rows being electrically connected respectively to a different one of said plurality of semiconductor devices, wherein each of said plurality of terminal rows comprises at least one specific terminal for transmitting a signal having a predetermined function, and a position of said specific terminal in each of said plurality of terminal rows is different from each other.

20. A module according to claim 19, wherein at least one of said plurality of semiconductor devices is a memory device.

21. A module according to claim 19, wherein said signal is selectively input to one of said plurality of semiconductor devices.

22. A module according to claim 19, wherein said plurality of terminals have a rectangular shape.

23. A module according to claim 19, wherein said plurality of terminals have a gull-wing shape.

24. A module according to claim 19, wherein at least one capacitor is mounted on at least one of said first and said second faces of said wiring board.

25. A module according to claim 19, wherein said plurality of semiconductor devices are four semiconductor devices mounted in a square mounting area with an arrangement in which one of two longer edges of each of said four semiconductor devices and one of two shorter edges of the neighboring semiconductor device are located side by side.

26. A module according to claim 25, wherein at least one capacitor is mounted in the center portion of said square mounting area.

27. A module according to claim 19, wherein said wiring board has a regular polygonal shape having n vertexes, n being equal to or more than 3.

28. A module according to claim 19, wherein said plurality of semiconductor devices are a plurality of bare IC chips.

29. A module according to claim 19, wherein said plurality of semiconductor devices are a plurality of TAB packages, wherein each of said plurality of TAB packages comprises:

a film carrier;

a bare IC chip being mounted on said film carrier; and outer leads formed along at least one of two longer edges of said film carrier, said outer leads being electrically connected to said bare IC chip.

30. A module according to claim 29 comprising a plurality of said TAB packages mounted on said wiring board, wherein two of said plurality of TAB packages are paired, said paired TAB packages being arranged in parallel so that each of said outer leads thereof points toward said peripheral edges of said wiring board, each of said outer leads being connected to respective outer lead pads arranged in a pair of parallel pad rows on said wiring board.

31. A module according to claim 30, wherein the other paired TAB packages are stacked overlapping said paired TAB packages in a criss-cross method.

32. A module according to claim 30, wherein shorter edges of said bare IC chip of each of said plurality of TAB packages is shorter than a half an interval between said pair of parallel pad rows.

33. A module according to claim 30, wherein at least one capacitor is mounted on a space between said pair of parallel pad rows.

* * * * *